(12) United States Patent
Koduri et al.

(10) Patent No.: US 7,189,938 B2
(45) Date of Patent: Mar. 13, 2007

(54) PROCESS AND SYSTEM TO PACKAGE RESIDUAL QUANTITIES OF WAFER LEVEL PACKAGES

(75) Inventors: Sreenivasan K. Koduri, Plano, TX (US); Matthew J. Stovall, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 11/036,714

(22) Filed: Jan. 14, 2005

(65) Prior Publication Data

US 2005/0121372 A1    Jun. 9, 2005

Related U.S. Application Data

(62) Division of application No. 10/161,257, filed on May 31, 2002, now Pat. No. 6,861,608.

(51) Int. Cl.
*B07C 5/344* (2006.01)

(52) U.S. Cl. ..................... 209/573; 209/574

(58) Field of Classification Search ............. 209/538, 209/573, 574, 939; 414/935, 936, 937, 940, 414/941
See application file for complete search history.

(56) References Cited

U.S. PATENT DOCUMENTS

| | | | |
|---|---|---|---|
| 3,847,284 A * | 11/1974 | Wiesler et al. ............. 209/3.3 |
| 4,907,701 A | 3/1990 | Kobayashi et al. ......... 209/576 |
| 5,313,156 A | 5/1994 | Klug et al. ................. 324/158 |
| 5,484,062 A | 1/1996 | Rich ........................... 209/587 |
| 5,743,695 A | 4/1998 | Ryu ............................ 414/222 |
| 6,479,777 B2 * | 11/2002 | Yamakawa ................. 209/574 |
| 6,547,902 B2 * | 4/2003 | Arai et al. .................... 156/64 |
| 6,685,073 B1 | 2/2004 | McKenna et al. ............ 225/2 |
| 6,773,543 B2 * | 8/2004 | Summers .................... 156/344 |
| 2002/0182759 A1 | 12/2002 | Yamagata et al. ............ 438/11 |
| 2003/0060025 A1 | 3/2003 | Tieber ......................... 438/464 |
| 2003/0188997 A1 | 10/2003 | Tan et al. .................... 209/564 |
| 2004/0171179 A1 * | 9/2004 | Farnworth et al. ........... 438/15 |

* cited by examiner

*Primary Examiner*—Joseph Rodriguez
(74) *Attorney, Agent, or Firm*—Yingsheng Tung; Wade James Brady, III; Frederick J. Telecky, Jr.

(57) ABSTRACT

Various preferred processes and equipment are described herein that more efficiently handle residual semiconductor parts during packaging. The processes include picking and removing all of the bad parts from a wafer before picking the good parts and picking all of the good parts first without picking any part necessary to align the wafer. The equipment includes several embodiments of a transfer machine that accommodates the efficient transfer of semiconductor parts between tacky film, waffle packs and tape and reel containment systems. Residual good parts are stored in waffle packs and can be subsequently reused in the packaging process.

7 Claims, 6 Drawing Sheets

BAR CODE
LABEL AREA

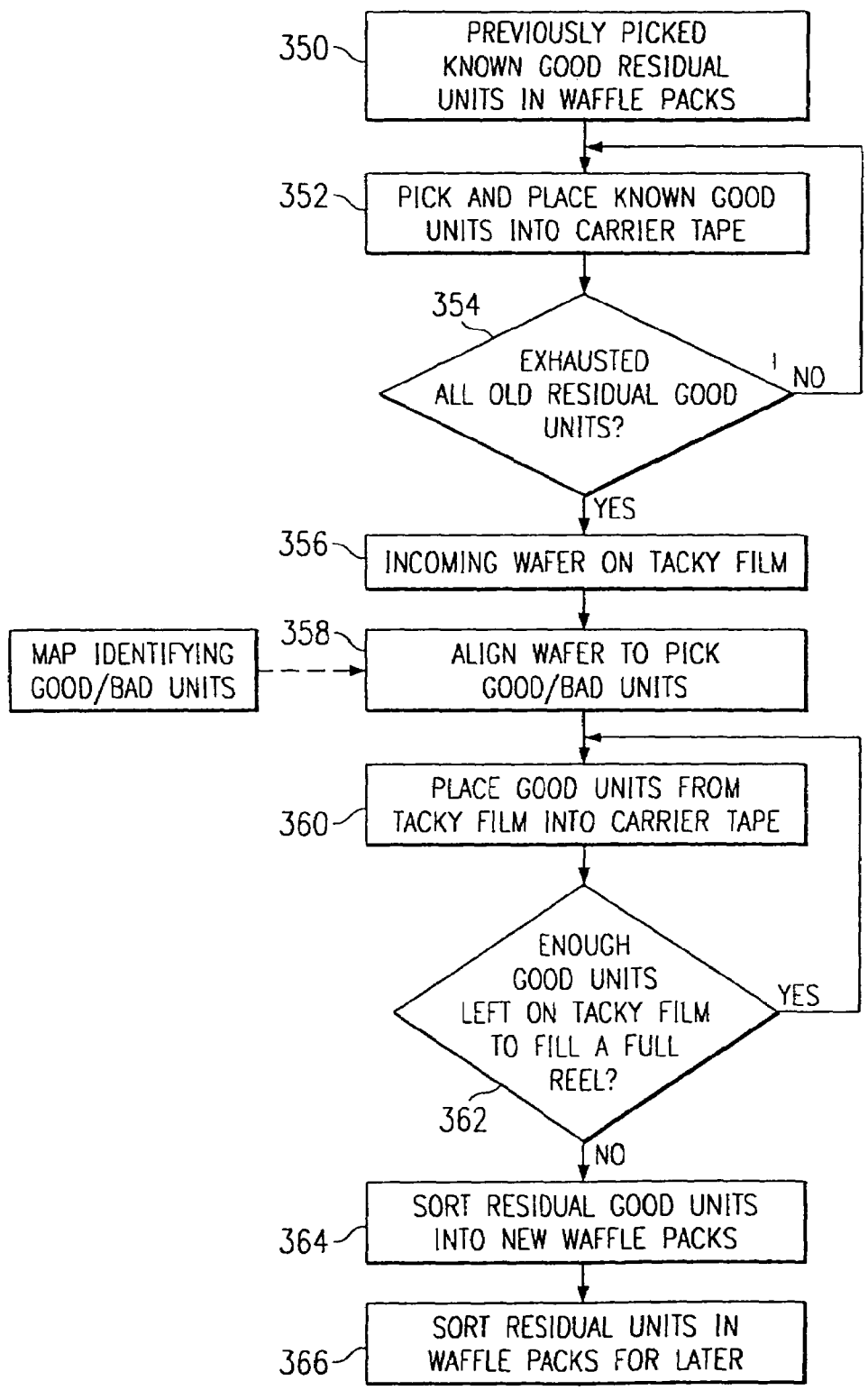

PROCESS AND SYSTEM TO PACKAGE RESIDUAL QUANTITIES OF WAFER LEVEL PACKAGES

This is a divisional application of application Ser. No. 10/161,257 filed on May 31, 2002, now U.S. Pat. No. 6,861,608 which is incorporated, in its entirety, herein by reference.

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to semiconductor packaging. More particularly, the invention relates to processes and equipment used to package semiconductor devices to more efficiently account for residual devices.

2. Background Information

Integrated circuits are generally constructed on crystalline semiconductor substrates shaped as thin, circular wafers. A number of types of semiconductors can be used; however, doped silicon is by far the most popular semiconductor substrate in use today. Although the cost of the silicon dioxide used to prepare the silicon wafer is relatively low, the process for preparing a highly pure, properly-doped crystalline silicon wafer is both slow and expensive. As a result, the semiconductor industry has invested significant effort in efficient use of the silicon substrate.

Integrated circuits are multilayer electronic devices built on the surface of the wafer substrate through a series of cleaning, patterning, etching, deposition, and annealing operations. These steps serve to construct the functional features of the device, layer by layer. The surface area required by a given integrated circuit is a function of both the complexity of the design—i.e., the number and arrangement of individual transistors, capacitors, resistors and other electronic circuit elements—and the dimensions of each electronic element. In general, the footprint of individual integrated circuits is much smaller than the surface area of the wafer. Consequently, a single wafer can generally yield multiple—often even thousands—of integrated circuits.

Integrated circuits typically are created using wafer-level processing techniques, meaning that the semiconductor processing steps necessary to produce functional circuits (i.e., cleaning, patterning, etching, deposition, and annealing) are performed on an entire wafer. The arrangement of integrated circuits on a wafer surface is depicted in FIG. 1. Because of the resemblance to city maps, the spaces between devices are commonly termed "streets." The streets are sacrificial areas reserved for cutting the wafer into the individual integrated circuits.

Referring still to FIG. 1, the single crystal wafers 11 used in semiconductor processing are not perfectly circular and instead have a flat portion 12 that allows proper orientation of the wafer crystal structure during processing and separation procedures. The integrated circuits 13 constructed on the wafer 11 are separated from one another by the grid of streets 14. Once the integrated circuits 13 are formed, the wafer II is placed on a film having a sticky surface. For obvious reasons, the film is generally referred to as "tacky film." FIG. 2 shows a wafer 11 adhered to a tacky film 17, and in turn to a flex frame 18.

Following the processing steps, the individual integrated circuits, which are frequently referred to as "chips" or "dies," must be separated from one another, optimally bonded to metal leads, and packaged in an appropriate ceramic or plastic housing. Chips typically are separated from one another on the wafer using a saw that cuts along the streets. The purpose of the tacky film 17 is to hold the individual integrated circuits in place during and after the separation step.

At some point after separation, the chips are placed into packing material to be delivered to an assembly process that electrically and mechanically bonds the chips to semiconductor packages or to printed circuit boards (PCBs). One common type of packing material is referred to as a "tape and reel" system. FIG. 3 shows a depiction of an exemplary tape and reel component delivery system 20. The tape and reel system generally comprises a carrier tape 22 and a cover tape 24 wound around a reel 26. The carrier tape includes numerous cavities 28 into which individual chips are placed. Once placed into a cavity 28, the chip is sealed in the cavity and protected by the cover tape 24. Specially designed pick and place machines individually pick chips from the tacky film and place them in cavities 28.

Not all of the chips formed on a wafer are necessarily acceptable devices. Some chips may suffer mechanical problems such as cracks and other chips may have electrical problems. For this reason, electrical and mechanical testing steps are performed as part of the manufacturing process. Those devices that fail the mechanical inspection are listed in a mechanical "map" and a similar map is created for those devices that fail an electrical test. Chips that are deemed unacceptable for customer use are termed "bad" chips. These maps also identify the good components (i.e., the devices that passed the mechanical and electrical tests). These maps are combined together into a single map. The single map identifies good and bad chips by their location relative to one or more reference points. The use of a typical good/bad map requires the wafer to have a set of physical reference markers (also called "alignment" markers) that identify a starting point for indexing the chips on the wafer. From this starting point, all of the chips are counted in a predefined order. The alignment markers may be special structures built into specific parts of the wafer or special devices contained thereon. In some cases, a set of dedicated units referred to as "mirror dies" are used to form shapes that can be clearly identified.

The identification of the alignment markers on the wafer and subsequent sequencing through the devices is generally performed by computer programmed machines with cameras, visual pattern recognition capabilities and other features which enable the machine to quickly and accurately pick the devices from the wafer. Once the wafer is aligned in the pick and place tool so that the tool is aware of the starting point, the tool accesses the good/bad map to determine the identity of the good and bad chips. The tool then picks the good chips, one at a time, and places the good chips on the carrier tape. Armed with the identity of the bad chips from the map, the tool skips over the bad units. Once the good devices have been picked off the wafer, the remaining bad device can be discarded.

Customers generally require each reel to have an exact and predetermined number of chips (e.g., 1000, 3000, 5000). A wafer on tacky film is loaded into a pick and place machine and aligned therein. A reel with carrier tape also is loaded into the machine. The pick and place tool then begins picking good units from the wafer and placing them into the tape. A wafer includes a certain number of good units that generally differs from the capacity of a single reel. For example, a particular wafer may have 20,500 total chips of which 20,100 are good (400 chips are bad). Further, the customer may require reels having exactly 3000 chips each. In this example, six complete reels can be filled with good chips leaving the partially picked wafer with 2100 good chips and 400 bad chips. The six reels of good chips then are delivered to the next part of the assembly process in which the chips are individually packaged or assembled.

The issue then becomes what to do with the remaining partially picked wafer still having a significant number of good chips (2100). Ideally, it would be desirable to save the chips on the tacky film and use the partially picked wafer to combine with the next build of that same chip. However, tacky film typically has a relatively short useful life of only a few days. After that, it becomes very difficult to pick the chips from the film without damaging the chips. Further, the chip manufacturer may not have an order of that same chip for several weeks or even longer. By that time, the previously partially picked wafer is unusable because of the limited useful life of the tacky film.

Another problem exists as well. In conventional packaging processes, the good chips are picked from the tacky film in the order they are listed in the map. In so doing, it is very likely that the alignment markers on the wafer will be disturbed. Once the alignment markers are disturbed, it is impossible to realign the wafer. As discussed above, the map identifies to the system the good chips and the bad chips in reference to a starting point. The identification of the starting point requires the wafer to be precisely aligned. If the wafer cannot be aligned, the system cannot use the map to discern the good from the bad chips on the wafer. Accordingly, a partially picked wafer, such as that described above in the example, cannot be reused in the pick and place machine even if the tacky film could last long enough. This is because, once the alignment markers are disturbed, there will be no way to install the partially picked wafer on tacky film in the machine during the next manufacturing run of the chip and align the wafer to permit the good/bad map to be used.

Often, the residual good and bad chips are used internally by the semiconductor manufacturer for engineering development purposes. It would be preferable, however, to be able to use the residual good chips for customer sales. Accordingly, a solution to this problem is needed.

BRIEF SUMMARY OF THE PREFERRED EMBODIMENTS OF THE INVENTION

The preferred embodiments of the present invention solve the problems noted above by using processes and equipment that more efficiently handle residual semiconductor devices. In accordance with one preferred embodiment of the invention, a tape and reel containment system is loaded by aligning a wafer containing a plurality of semiconductor devices, selecting good devices from the wafer in accordance with a previously generated good/bad map, transferring the good devices to a tape and reel until the tape contains a predetermined quantity of good devices, and then transferring the residual good devices from the wafer to a containment system other than a tape and reel without removing and realigning said wafer. Such containment systems other than a tape and reel may comprise a set of waffle packs. This embodiment permits residual good parts to be temporarily stored and, as summarized below, then used in a subsequent run of a new wafer batch of the same part.

In accordance with another preferred embodiment, chips previously stored in non-tacky film containers are used in subsequent runs of a device. As such, a tape and reel containment system is loaded by picking semiconductor devices from a containment system other than tacky film, transferring those picked devices to a tape and reel, then selecting good devices from a new wafer in accordance with a previously generated map, and transferring the good devices selected from the wafer to the tape and reel. This process advantageously picks residual good parts from, for example, a set of waffle packs, previously stored in accordance with the embodiment described above, into a tape and reel system and then proceeds with picking good parts from a new wafer.

In accordance with yet another embodiment, good semiconductor devices are separated from bad semiconductor devices formed from wafer on tacky film by identifying each bad device using a good/bad map, removing and discarding all bad devices from the tacky film, and after removing all bad devices, then picking good devices from the tacky film for placement in a chip containment system. This embodiment permits a partially picked wafer to be removed from the pick and place machine and then reinstalled. Realignment of the wafer is unnecessary because only good parts remain on the wafer and thus the good/bad map is unnecessary (alignment is generally only necessary to be able to use the good/bad map).

Further still, another preferred embodiment, a method of separating good semiconductor devices from bad semiconductor devices formed from a wafer placed in a transfer machine comprises aligning the wafer, identifying and picking good devices from the wafer using a good/bad map without picking any devices involved in aligning the wafer, and updating the map to reflect the good devices that have been removed from the wafer. This embodiment permits a partially picked wafer to be removed from the pick and place machine, then reinstalled on the machine and realigned, thereby permitting temporary storage of a partially picked wafer and its subsequent reuse.

The following describes two additional preferred embodiments of semiconductor device transfer machines used in conjunction with the above processes. One embodiment of a transfer machine comprises a plurality of stations in which at least three of the stations accommodate a different type of chip containment medium. The machine also includes a pick and place tool accessible to each of the stations and capable of transferring chips from one station to another. The pick and place tool preferably is reachable between the various stations. This embodiment permits efficient transfer of semiconductor parts from one type of containment medium to another in a way that avoids the residual part problems noted above.

Another embodiment of a semiconductor transfer machine also comprises a plurality of stations, at least three of the stations accommodating a different type of chip containment medium, a turn table rotatably accessible to each of the plurality of stations. The turn table comprises a plurality of pockets into which semiconductor devices are placed to transfer the devices from one station to another. The machine also includes a plurality of pick and place tools accessible by the turn table and the stations, one pick and place tool located at each station and capable of transferring a chip between its corresponding station and a pocket on the turn table. This embodiment achieves some or all of the benefits of the transfer machine described above, but uses a different mechanism to actually transfer semiconductor parts between stations.

These and other aspects of the preferred embodiments of the present invention will become apparent upon analyzing the drawings, detailed description and claims, which follow.

BRIEF DESCRIPTION OF THE DRAWINGS

For a detailed description of the preferred embodiments of the invention, reference will now be made to the accompanying drawings in which:

FIG. 7 shows another preferred process for filling a tape and reel containment system first using residual devices left over from a previous wafer run.

NOTATION AND NOMENCLATURE

Figure 1:
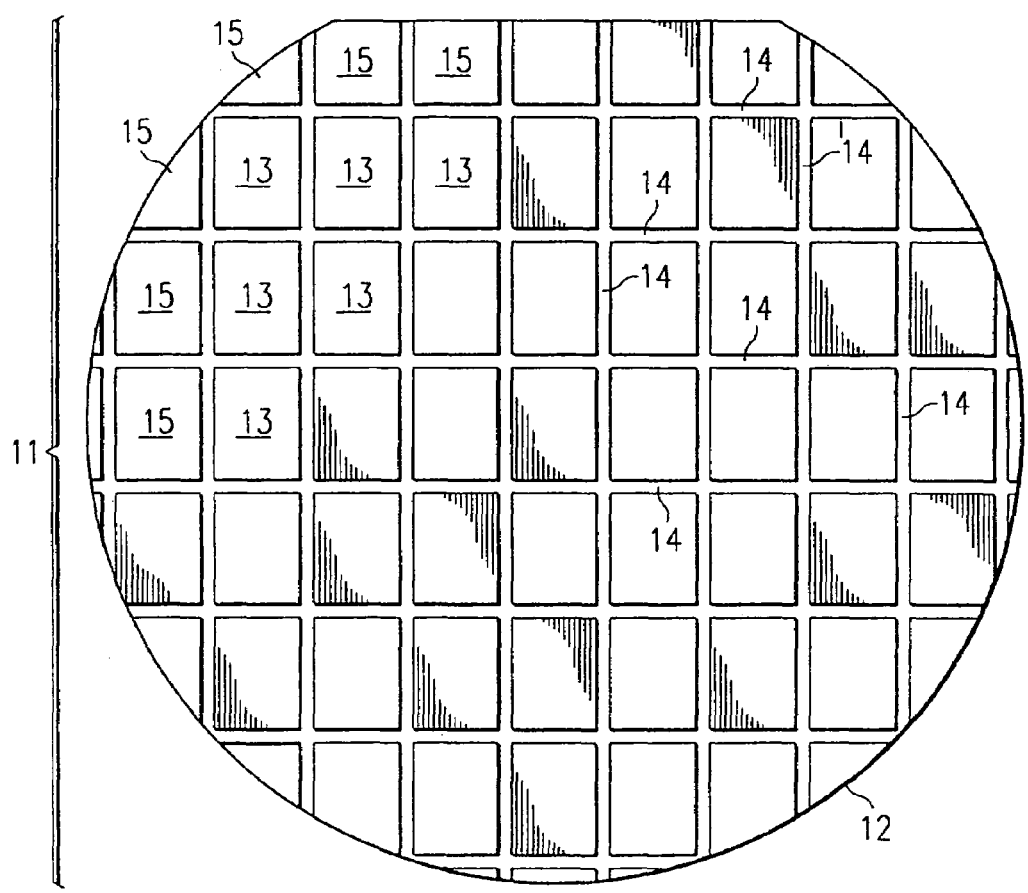
FIG. 1 shows an example of an integrated circuit layout on a wafer.
Figure 2:
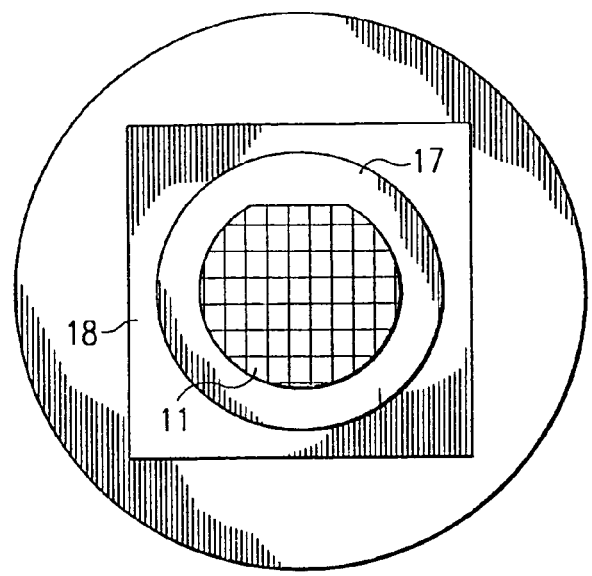
FIG. 2 shows a wafer on tacky film.
Figure 3:
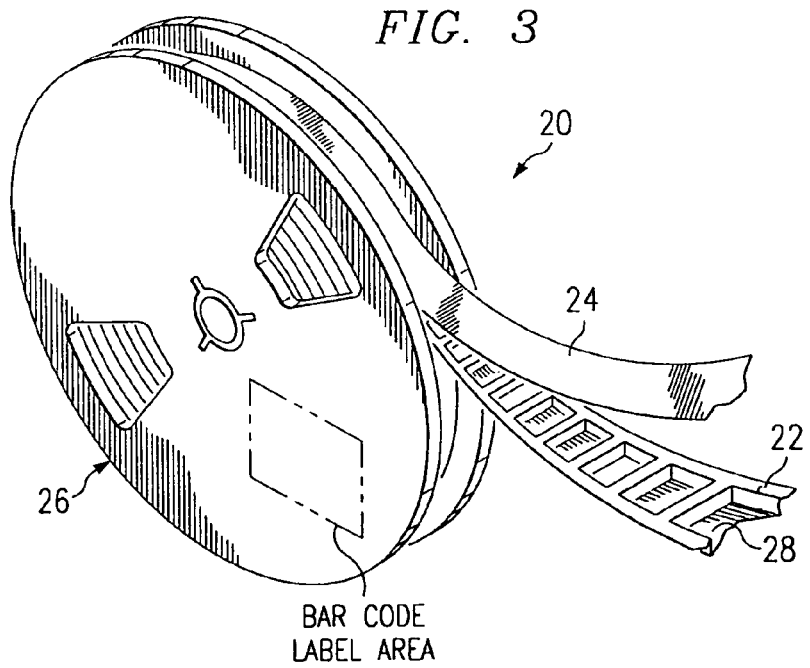
FIG. 3 depicts a tape and reel packing system.

Certain terms are used throughout the following description and claims to refer to particular system components. As one skilled in the art will appreciate, semiconductor companies may refer to a component and sub-components by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either a direct or indirect electrical connection. Thus, if a first device couples to a second device, that connection may be through a direct electrical connection, or through an indirect electrical connection via other devices and connections. The term "waffle pack" refers to any container that can hold singulated devices, and also include trays, boats, etc. To the extent that any term is not specially defined in this specification, the intent is that the term is to be given its plain and ordinary meaning.

DETAILED DESCRIPTION OF THE PREFERRED EMBODIMENTS

As explained above, a problem with conventional packaging techniques is that once a wafer has been partially picked, the alignment markers may have been disturbed. Once the markers are disturbed and the partially picked wafer removed from the machine, it becomes difficult, if not impossible, to replace and realign the wafer on the machine. Moreover, if the wafer cannot be realigned, the map cannot be used to distinguish the good from the bad parts.

In accordance with one embodiment of the invention, the following preferred process can solve the aforementioned problem. The preferred process includes first using the map to pick all of the bad parts from the wafer as well as any special units on the wafer that are not going to be shipped to the customer. These initially picked parts can be discarded. At this point, the remaining chips on the wafer are electrically and mechanically acceptable (i.e., parts identified on the map as "good"). Because all of the remaining parts on the wafer are good, there is no further need for the map. The remaining parts thus can be picked in any order at any time without having to worry about the possibility of picking bad parts.

This process permits a partially picked wafer to be removed from a pick and place machine and then reinstalled at a later time without having to realign the wafer in synch with the map. One of ordinary skill in the art will recognize that a limitation with this embodiment is that all of the good parts should be picked from the tacky film within the usable life of tacky film. Traditional tacky film has a limited shelf life time of two to three days. On the other hand, an ultraviolet (UV) release tacky film, such as D-611 made by Lintec, can provide an extended shelf life of two weeks or more. Accordingly, UV release tacky film can be used to ameliorate the effects of a traditional tacky film having a relatively short life. This is particularly advantageous, in a high volume frequent production environment. By following this process, an integer number of reels can be filled during the first processing of the wafer and the residual good parts can be left on the UV tacky film in a safe storage. When there is a need for the same device again, before the expiration time of the UV film, the partially picked wafer can be combined with the next lot of wafers. By using the old partial wafer first, and leaving any residual devices from the new lot from a new wafer, the storage life of the residuals can be continuously renewed. The limitation is still the usable life of the tacky film, but with UV tacky film, two weeks of storage life is often acceptable for most high volume manufacturing.

In accordance with a second embodiment of the invention, the following process is implemented. This process includes leaving all of the units on the wafer that are required for the alignment to the very end. Only the good units that do not form a part of the alignment references are picked first. Accordingly, all good parts are picked first while leaving alignment-related parts on the wafer on tacky film. Also, as the units are picked, the map is updated to reflect that the picked units are unavailable for subsequent picking. In this way, the wafer can be realigned multiple times and the parts can be picked in subsets as needed, without the fear of disturbing the mapped units. As before, this embodiment advantageously permits realignment and thus reuse of a partially picked wafer, but does so within the usable life span of the tacky film (conventional or UV release).

The following discussion describes a third embodiment of the invention which avoids the limitation of the tacky film's usable life. This third embodiment is conceptually depicted in FIG. 4 which shows a pick and place machine 100. As shown, the pick and place machine includes at least three stations 102, 104 and 106, each station accommodating a different type of chip container. A sawn wafer 11 on tacky film 17, a flex frame 18 and a wafer chuck 19 is accommodated at station 102. A carrier tape 22 and reel 20 is accommodated at station 104 while a set of waffle packs 30 is accommodated at station 106. The waffle packs 30 preferably comprises a plastic matrix tray for holding a chip. The waffle packs may be in any suitable size such as, and without limitation, 2"×2" or 4"×4". The waffle packs 30 comprises a plurality of pockets 32, each pocket 32 capable of accommodating an individual chip.

The machine 100 also includes a single pick and place tool 40. In general, the pick and place tool 40 can reach between each of the stations 102, 104 and 106 to move individual parts between the various stations. More specifically, the pick and place tool 40 preferably is capable of transferring chips from the tacky film 17 at station 102 to carrier tape 22 at station 104 as well as to waffle pack 30 at station 106. Additionally, the machine 100 also has the capability of transferring chips from the waffle pack station 106 to the carrier tape 22 at station 104. By having these capabilities, the machine 100 first can fill the carrier tape 22 from the tacky film 17 with a predetermined quantity of chips. Then, any residual good chips are placed into one or more waffle packs 30. The machine 100 thus advantageously permits all of the good chips from a wafer batch to be exhausted on the carrier tapes 22 and waffle packs 30 without having to remove and replace the tacky film. The tacky film and wafer are loaded and aligned once and thus, the problem noted above, regarding realignment of a partially picked wafer and life of the tape, are avoided.

The known good quantity of residual chips can thus be stored in waffle packs for an extended period of time until subsequently needed for placement on to a carrier tape. At that time, the previously fully or partially filled waffle pack can be loaded back into machine 100. A new carrier tape 22 then can be populated first by the residual chips from the waffle pack at station 106 and then from a new wafer 11 on the tacky film at station 102.

The pick and place tool 40 thus preferably has access to all three work stations 102–106. The wafer chuck 19 under the flex frame 18 can provide the motion needed to place the correct chip from the pick and place tool 40. Similarly, an X-Y table (not shown) under the waffle pack can position any chip accurately in the range of the pick and place tool 40. Additionally, handling mechanisms can be incorporated as known by those of ordinary skill in the art to the various work stations. Further, the cameras 24, 26 and 34 at the stations perform one or more of the following functions: alignment and inspections.

A fourth station (not shown) can be included if desired as part of pick and place machine 100. This fourth station preferably is used to collect reject parts (i.e., parts that are considered "bad"). This fourth station also can be used to place rejected chips from the inspection from any of the three primary stations 102–106 shown in FIG. 1.

As an additional feature, in some cases it might be desirable to "flip" a chip before or while moving the part from one station to another. As such, another station (not shown) can be added to the pick and place machine 100 of FIG. 4. This station would perform the function of flipping a chip in transit from one carrier medium to another. Flipper equipment is well known in the art and thus not described in detail herein. Another station dedicated to automatic 2D and/or 3D inspection of the parts can also be added.

Figure 4:
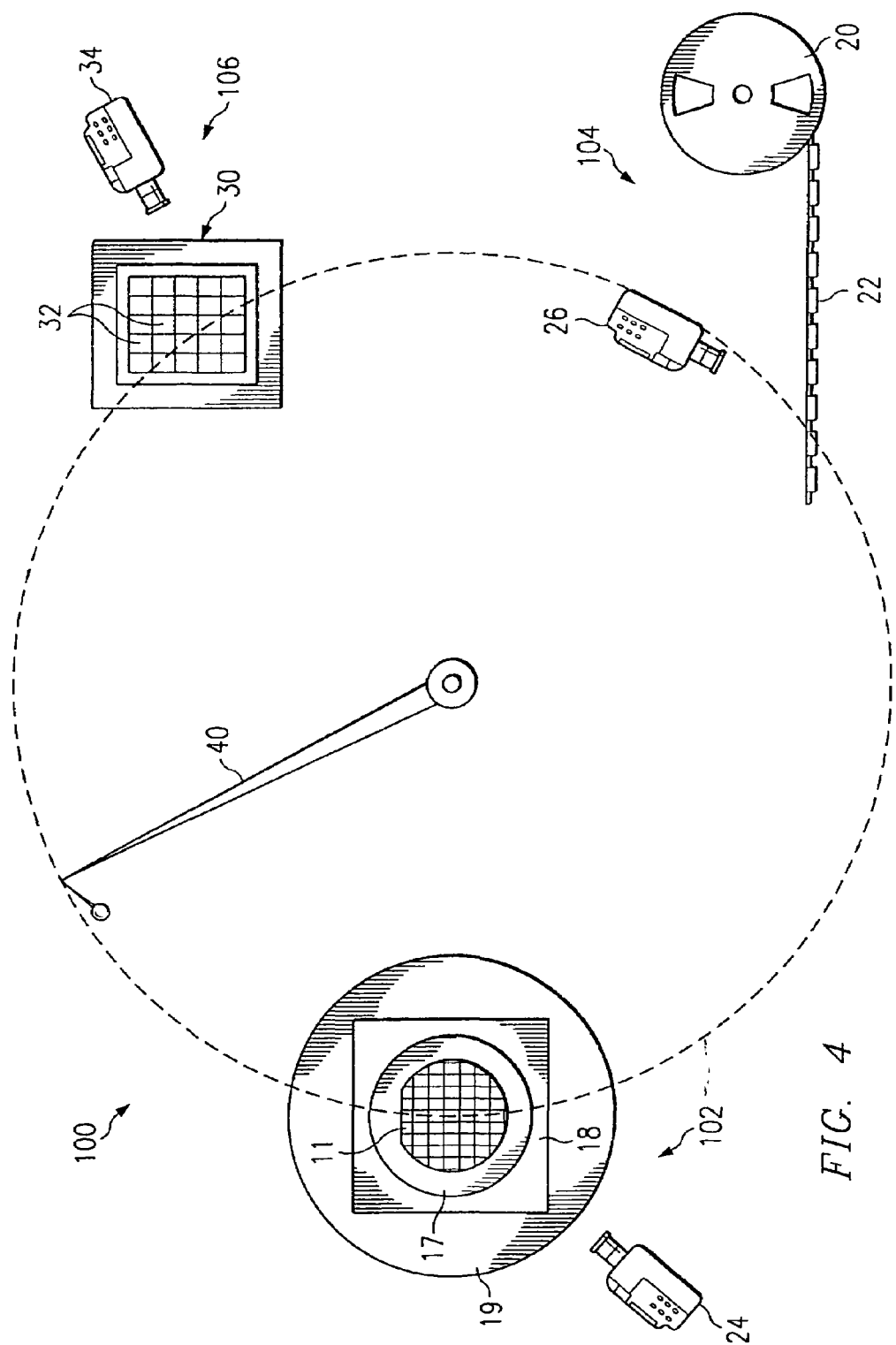
FIG. 4 shows a preferred embodiment of a semiconductor device transfer machine.

The transfer machine of FIG. 4 can also be used to perform the methods described above including first removing and discarding all of the bad devices to obviate any future need for the good/bad map thereby permitting wafer removal and reinstallation. Further, machine 100 can be used to pick all of the good parts first without disturbing the alignment markers (identified in the map), thereby permitting subsequent realignment of the wafer.

Figure 5:
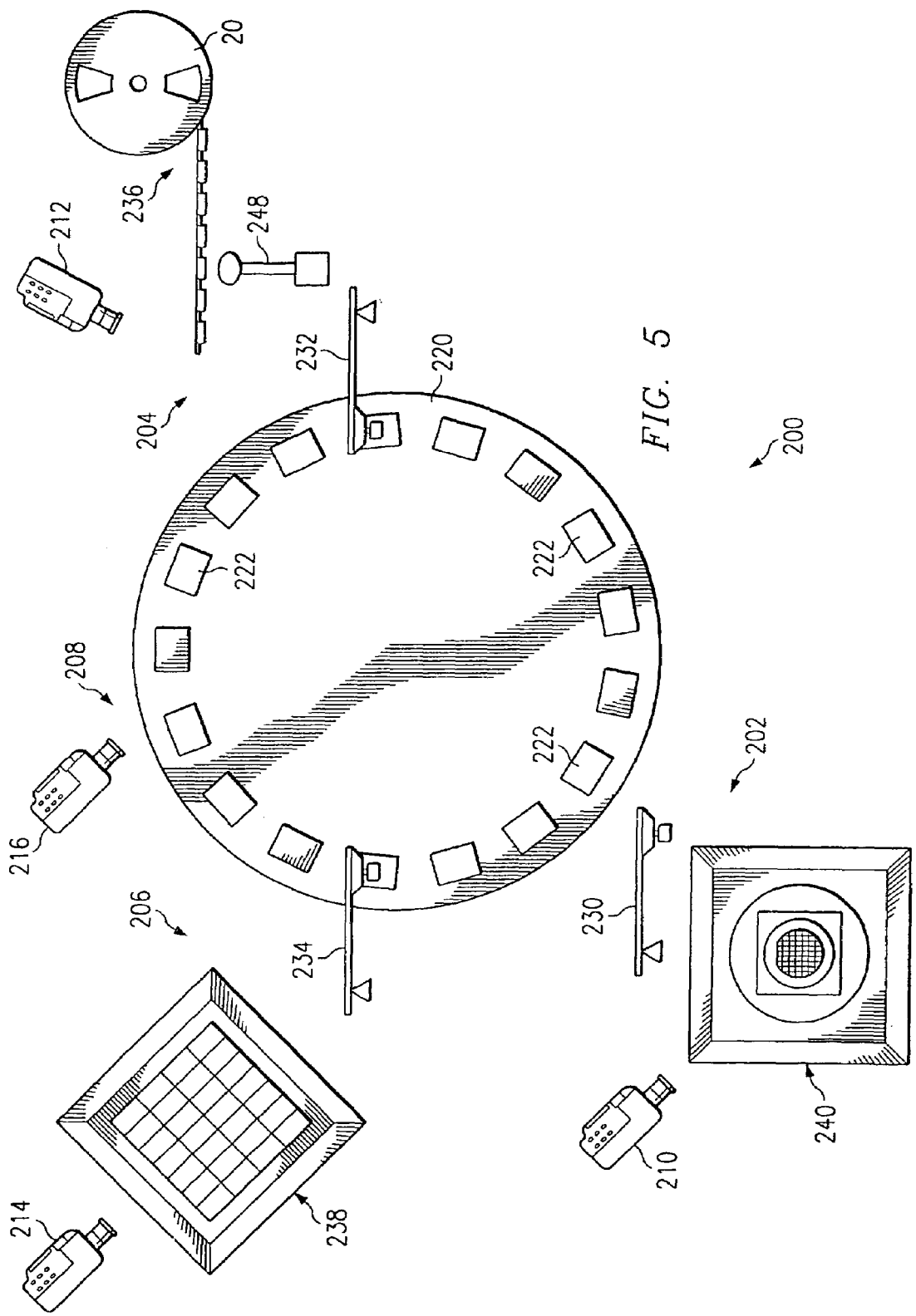
FIG. 5 shows another preferred embodiment of a semiconductor device transfer machine.

Another preferred embodiment of a transfer machine is shown in FIG. 5. Transfer machine 200 is shown comprising a plurality of work stations. The work stations shown in the embodiment of FIG. 5 include a wafer on flex frame station 202, a tape and reel station 204, a waffle pack station 206 and an inspection station 208. The function performed by each of these stations is described above with regard to the transfer machine 100 of FIG. 4. Each work station includes a camera 210, 212, 214, 216 as shown. In FIG. 5, rather than having a single pick and place tool that rotates between the various stations, transfer machine 200 includes a pick and place tool at each station and a turn table 220 which rotates between the various work stations. As shown, the wafer on flex frame station 202 includes a pick and place tool 230, tape and reel station 204 includes a pick and place tool 232, and waffle pack station 206 includes a pick and place tool 234. The turntable 220 includes a plurality of pockets 222 into which individual chips can be placed. Alternatively, each pocket may be designed so as to be able to accommodate a plurality of chips. Each pick and place tool 230, 232 and 234 can pick a chip from its respective station containment medium (e.g., tacky film, waffle pack) and place the chip in a pocket 222 in the turntable 220. Thus, chips from the tacky film at the wafer on flex frame station 240 can be placed onto the turntable 220 for movement over to the tape and reel station for subsequent placement therein by pick and place tool 232. Similarly, chips from the waffle pack 238 at the waffle pack station 206 can be placed onto the turntable 220 for movement over to the tape and reel station for subsequent placement therein by pick and place tool 232. FIG. 5 further depicts a flipper 248 discussed previously for inverting a chip, if desired.

The transfer machines 100 and 200 preferably are controlled by a control system (not specifically shown) coupled to the various pick and place tools, cameras, turntable (in the case of the embodiment of FIG. 5), and the like. The control system coordinates the transfer of the chips between stations and other functions well known to those of ordinary skill in the art.

Figure 6:
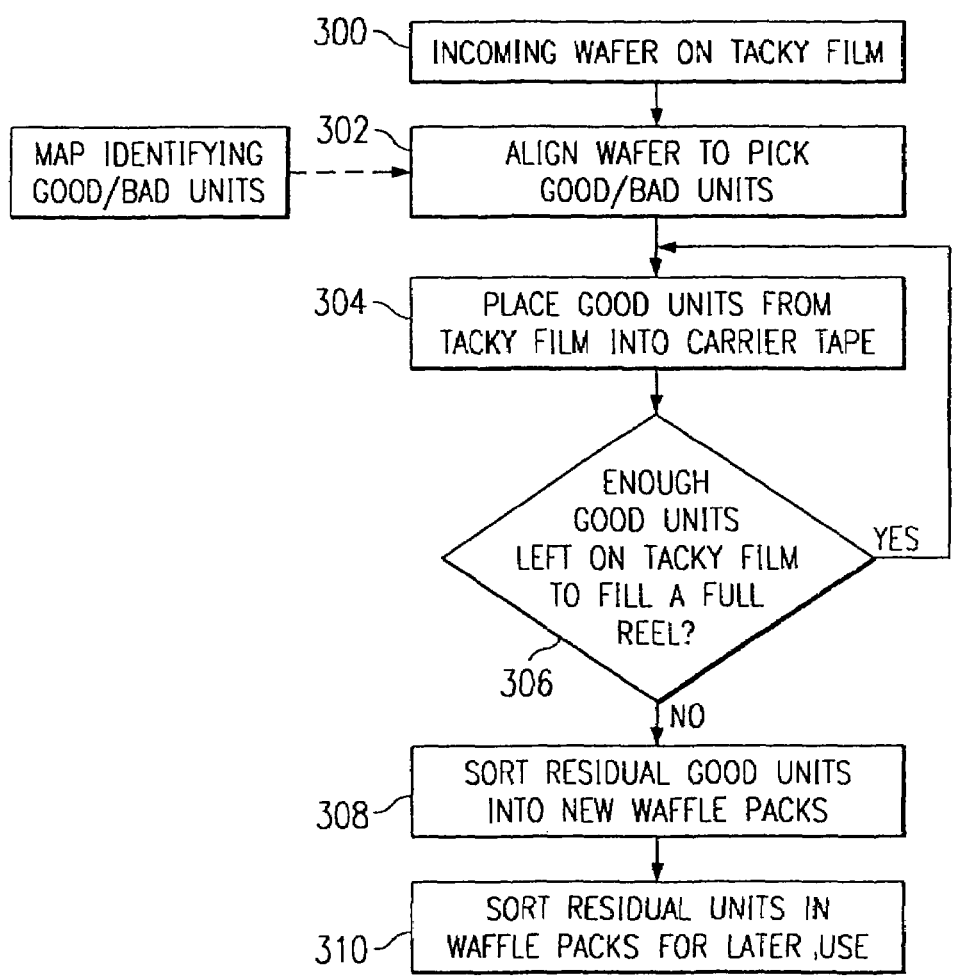
FIG. 6 shows a preferred process for filling a tape and reel containment system using the transfer machines of FIGS. 4 and 5 and storing any good residual devices in a waffle pack.

The use of transfer machines 100 and 200 is illustrated in the flowcharts of FIGS. 6 and 7. FIG. 6 shows a preferred process using a preferred transfer machine 100 or 200 for the first wafer lot run of a given device while FIG. 7 shows the use of a transfer machine for subsequent wafer lot rims of the same device.

Referring now to FIG. 6, the process for picking placing chips from the first wafer lot of a given device begins at step 300 in which the incoming wafer on tacky film is placed into the machine's station that accommodates wafers on tacky film (station 102 in FIG. 4 and station 202 in FIG. 5). In process 302 the wafer is aligned so that the map identifying the good and bad units can be used. Once aligned, at 304 the good chips are picked from the tacky film and placed by the transfer machine into the carrier tape at station 104, 204. Process 304 continues until all of the carrier tapes are filled by the wafer to the predetermined quantities and there are not enough residual good chips left, as determined by process 306, to completely fill a tape with the predetermined quantity. If this latter condition is true (not enough chips remaining to fill a tape), then in process 308 the transfer machine 100, 200 transfers the remaining good residual chips from the tacky film station 102, 202 to the waffle pack(s) station 106, 206. Process 310 indicates that these waffle pack(s) residual chips can be stored for later use if another run of the same device is needed. Such a subsequent run is depicted in FIG. 7.

Referring now to FIG. 7, the process shown comprises the preferred process for a subsequent wafer run of a particular chip for which previous good residual chips have been stored in waffle packs. Such waffle packs containing good chips are loaded into the transfer machine 100, 200 at stations 102, 202 (process 350). Then, in process 352, the transfer machine picks chips from the waffle pack(s) and moves them to the tape and reel station 104, 204 for placement onto the tape. Once all of the residual good units are exhausted from the waffle pack(s), as determined by process 354, then the good chips from a new wafer on tacky film can be picked and placed on the tape. This process begins with process 356 in which the new wafer is installed in the machine. Alternatively, the new wafer may have been previously installed. In process 358, the new wafer is aligned so as to permit use of the map, or alignment may have occurred previously. In process 360, the good chips from the wafer on tacky film is transferred from the tacky film station 102, 202 to the tape and reel station 104, 204. Once the tapes are completely filled with the predetermined quantities, as determined at process 362, all residual good chips are moved, as indicated by process 364, by the transfer machine 100, 200 to the waffle pack station. Finally, process 366 indicates as before that the waffle packs with good residual chips can be stored for a subsequent run of the same device.

Thus, FIG. 7 shows a preferred process wherein all, or at least some, residual good chips from a previous wafer run are used to fill a tape and reel medium. Then, once the residual chips are exhausted, chips from a new wafer still on tacky film are selected for placement into the tape and reel.

Moreover, the embodiments described herein provide a significant advance over conventional techniques. The preferred embodiments of the invention solve one or more of the problems discussed previously. The above discussion is meant to be illustrative of the principles and various embodiments of the present invention. Numerous variations and modifications will become apparent to those skilled in the art once the above disclosure is fully appreciated. For example, in addition to packaging chips from a wafer on a tacky tape, the procedure can also be used for packages assembled together as strips on a tacky tape, a jig or any device that can hold chips under vacuum pressure. Further, at least one of the stations in the transfer machine can be used to electrically test a chip. Also, a station can be included by which an identifier can be placed on each chip. The identifier could be a part number, serial number, manufacturer name, and the like. It is intended that the following claims be interpreted to embrace all such variations and modifications.

What is claimed is:

1. A method of unloading semiconductor devices from a wafer, comprising:
    (a) placing a wafer containing a plurality of good semiconductor devices on a wafer chuck;
    (b) selecting good devices from said wafer in accordance with a wafer map;
    (c) transferring said selected devices to a first device containment system until the first device containment system contains a predetermined quantity of good devices;
    (d) transferring the residual good devices from said wafer to a second containment system different from the first device containment system; and
    (e) transferring the good devices from the second containment system to a second first-device-containment system.

2. The method of claim 1 wherein (d) includes transferring the residual good devices to a waffle pack.

3. The method of claim 2 further including transferring said residual good devices from said waffle pack to a tape and reel until said residual good devices are exhausted and then transferring good units from a new wafer to said tape and reel.

4. The method of claim 1, in which the first device containment system is a tape and reel system.

5. The method of claim 1, in which the second device containment system is a waffle pack.

6. The method of claim 1, in which the wafer is placed on a sticky tape.

7. The method of claim 1, in which the transferring takes place prior to selecting good devices from said wafer.

* * * * *